(12) United States Patent
Saiki et al.

(10) Patent No.: US 8,338,890 B2
(45) Date of Patent: Dec. 25, 2012

(54) SEMICONDUCTOR DEVICE AND METHOD FOR MANUFACTURING SEMICONDUCTOR DEVICE

(75) Inventors: Takayuki Saiki, Chino (JP); Shinya Sato, Chofu (JP); Hiroyuki Takamiya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 324 days.

(21) Appl. No.: 12/627,652

(22) Filed: Nov. 30, 2009

(65) Prior Publication Data

US 2010/0133701 A1    Jun. 3, 2010

(30) Foreign Application Priority Data

Dec. 1, 2008    (JP) ................. 2008-306228

(51) Int. Cl.
    *H01L 23/62* (2006.01)
(52) U.S. Cl. ............ 257/355; 257/203; 257/177; 438/3; 361/111
(58) Field of Classification Search ............... 257/355, 257/203, 777, 366, 362, 206; 438/3; 361/111
    See application file for complete search history.

(56) References Cited

U.S. PATENT DOCUMENTS

| | | |
|---|---|---|
| 5,703,747 A | 12/1997 | Voldman et al. |
| 5,731,945 A | 3/1998 | Bertin et al. |
| 5,807,791 A | 9/1998 | Bertin et al. |
| 5,930,098 A | 7/1999 | Voldman et al. |
| 5,943,254 A | 8/1999 | Bakeman, Jr. et al. |
| 5,949,139 A | 9/1999 | Imura et al. |
| 7,420,281 B2 | 9/2008 | Tsunozaki |
| 2006/0006501 A1 * | 1/2006 | Kawano ................. 257/625 |
| 2008/0290493 A1 | 11/2008 | Tsunozaki |
| 2009/0283898 A1 * | 11/2009 | Janzen et al. ............ 257/698 |
| 2010/0078635 A1 * | 4/2010 | Kuroda et al. ............ 257/48 |
| 2011/0042795 A1 * | 2/2011 | Knickerbocker ........ 257/686 |

FOREIGN PATENT DOCUMENTS

| | | |
|---|---|---|
| JP | A-08-250643 | 9/1996 |
| JP | A-10-163411 | 6/1998 |
| JP | A-10-321742 | 12/1998 |
| JP | A 2007-49103 | 2/2007 |
| JP | 2007294746 A * | 11/2007 |
| WO | WO 2005/053025 A1 | 6/2005 |

* cited by examiner

*Primary Examiner* — Telly Green
(74) *Attorney, Agent, or Firm* — Oliff & Berridge, PLC

(57) ABSTRACT

A semiconductor device includes: a plurality of external terminals; a plurality of semiconductor substrates that are layered; a through electrode penetrating through at least one of the semiconductor substrates and electrically connected with any of the external terminals; and a plurality of electrostatic discharge protection circuits provided on any one of the semiconductor substrates. In the device, the through electrode is electrically connected with the plurality of electrostatic discharge protection circuits.

5 Claims, 4 Drawing Sheets

SEMICONDUCTOR DEVICE AND METHOD FOR MANUFACTURING SEMICONDUCTOR DEVICE

The entire disclosure of Japanese Patent Application No. 2008-306228, filed Dec. 1, 2008 is expressly incorporated by reference herein.

BACKGROUND

1. Technical Field

The present invention relates to a semiconductor device and a method for manufacturing a semiconductor device.

2. Related Art

As an electronic apparatus is downsized, a mounting space for an electronic component such as a semiconductor device which is mounted inside the electronic apparatus is decreased. Therefore, electronic components such as a semiconductor device are required to be further limited.

As a method for downsizing a semiconductor device, a method in which a semiconductor device is structured by layering semiconductor substrates (semiconductor chips) is proposed. In this method, semiconductor chips having the same functions as each other or semiconductor chips having different functions from each other are layered and wiring-connected with each other so as to achieve high density mounting of the semiconductor chips.

As a method for wiring-connecting the semiconductor chips, a method in which a through electrode (wiring electrode penetrating through the semiconductor chips) is provided on the semiconductor chips so as to wiring-connect the semiconductor chips is proposed.

In a case where the through electrode is electrically connected with an external terminal of the semiconductor device, a circuit element on the semiconductor chips may be damaged by static electricity inputted through the external terminal. Therefore, it is common to provide an electrostatic discharge (ESD) protection circuit which serves as a discharge path for electric charge inputted by static electricity.

However, an element used in the electrostatic discharge protection circuit (for example, a transistor or a diode) is difficult to be downsized and is usually larger than other circuit elements. Therefore, the electrostatic discharge protection circuit may degrade area efficiency of the semiconductor chips and degrade latitude of layout design (arrangement and wiring design) of the semiconductor chips.

SUMMARY

The present invention is devised in view of the above technical problems. An advantage of the present invention is to provide a semiconductor device in which area efficiency and latitude of layout design are improved and to provide a method for manufacturing such a semiconductor device.

A semiconductor device according to a first aspect of the invention includes: a plurality of external terminals; a plurality of semiconductor substrates that are layered; a through electrode penetrating through at least one of the semiconductor substrates and electrically connected with any of the external terminals; and a plurality of electrostatic discharge protection circuits provided on any one of the semiconductor substrates. In the device, the through electrode is electrically connected with the plurality of electrostatic discharge protection circuits.

According to the first aspect, the electrostatic discharge protection circuits can be integrated on any one of the semiconductor substrates. Accordingly, the electrostatic discharge protection circuits are not required to be formed on the rest of the semiconductor substrates, so that area efficiency is improved and latitude of arrangement and wiring of the circuit element is improved.

In the semiconductor device of the first aspect, the through electrode may be formed in a plural manner, and the plurality of electrostatic discharge protection circuits may be electrically connected with any of the plurality of through electrodes.

In the semiconductor device of the first aspect, the semiconductor substrate on which the plurality of electrostatic discharge protection circuits are provided may be one of a semiconductor substrate that is a lowermost layer and a semiconductor substrate that is an uppermost layer.

In the semiconductor device of the first aspect, the semiconductor substrate on which the plurality of electrostatic discharge protection circuits are provided may be manufactured by a larger design rule than that for the rest of the semiconductor substrates.

In the semiconductor device of the first aspect, a simple electrostatic discharge protection circuit electrically connected with at least one of the through electrodes and having a lower electrostatic discharge protection function than the electrostatic discharge protection circuits may be provided on at least one of the semiconductor substrates except for the semiconductor substrate on which the plurality of electrostatic discharge protection circuits are provided.

According to a second aspect of the invention, a method for manufacturing a semiconductor device including a plurality of external terminals and a plurality of semiconductor substrates that are layered, includes: providing a plurality of electrostatic discharge protection circuits on any one of the semiconductor substrates; providing a through electrode penetrating through at least one of the semiconductor substrates and electrically connected with any of the plurality of external terminals and any of the plurality of electrostatic discharge protection circuits of the semiconductor device; and electrically connecting the plurality of electrostatic discharge protection circuits and the through electrode.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment according to the invention will be described below with reference to the accompanying drawings. However, it should be noted that the invention is not limited to the following embodiment. The present invention includes any combination of contents of the following description.

Figure 1:
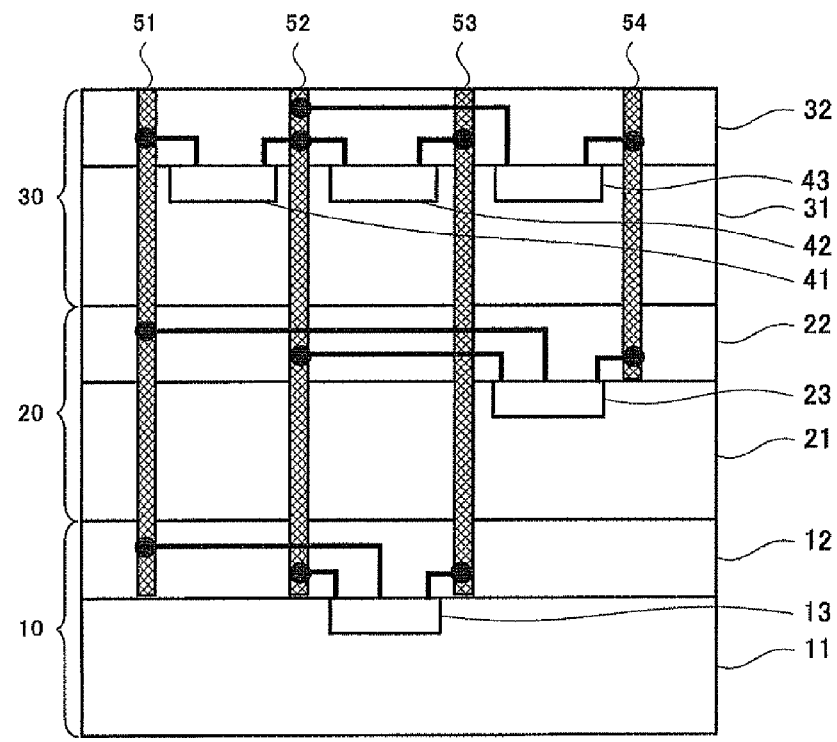
FIG. 1 is a schematic view for explaining an internal structure of a semiconductor device according to an embodiment of the invention.

FIG. 1 is a schematic view for explaining an internal structure of a semiconductor device according to the embodiment of the invention. The semiconductor device according to the embodiment includes external terminals VDD, VSS, Pin1, and Pin2 as well as elements shown in FIG. 1.

This semiconductor device 1 according to the embodiment includes a plurality of semiconductor substrates. FIG. 1 shows a structure in which semiconductor substrates 10, 20, and 30 are layered.

The semiconductor substrate 10 includes a semiconductor layer 11 and a wiring layer 12. The semiconductor layer 11 is a layer on which a circuit element such as a transistor is formed and is made of a semiconductor containing Si, for example. The wiring layer 12 is a layer on which a wiring for electrically connecting the circuit element, which is formed on the semiconductor layer 11, and a through electrode (details are described later) is formed. The wiring is made of a metal such as Al and Cu.

In a similar manner, the semiconductor substrate 20 includes a semiconductor layer 21 and a wiring layer 22, and the semiconductor substrate 30 includes a semiconductor layer 31 and a wiring layer 32.

The semiconductor substrate 10 includes an internal circuit 13 in the semiconductor layer 11 thereof. The semiconductor substrate 20 includes an internal circuit 23 in the semiconductor layer 21 thereof.

The semiconductor substrate 30 includes electrostatic discharge protection circuits 41, 42, and 43 in the semiconductor layer 31 thereof. The electrostatic discharge protection circuits 41, 42, and 43 serve as a discharge path for an electric charge inputted from an external terminal (not shown) by static electricity, and are formed for protecting the internal circuits 13 and 23 from damage by electrostatic discharge.

The semiconductor device according to the embodiment includes through electrodes 51, 52, 53, and 54. The through electrodes 51, 52, 53 and 54 penetrate through at least one of the semiconductor substrates 10, 20, and 30 and are electrically connected with respective external terminals which are not shown.

The through electrode 51 penetrates through the semiconductor substrates 20 and 30 and is electrically connected with an external terminal VDD. The through electrode 52 penetrates through the semiconductor substrates 20 and 30 and is electrically connected with an external terminal VSS. The through electrode 53 penetrates through the semiconductor substrates 20 and 30 and is electrically connected with an external terminal Pin1. The through electrode 54 penetrates through the semiconductor substrate 30 and is electrically connected with an external terminal Pin2.

Figure 2:
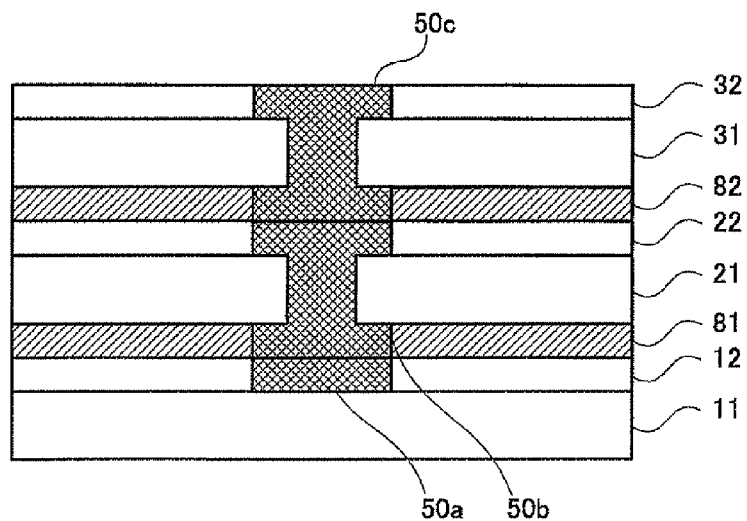
FIG. 2 is a schematic view for explaining an example of a structure of a through electrode.

The through electrodes may be formed after the semiconductor substrates are layered. As shown in FIG. 2 showing an example of a structure of a through electrode, the through electrodes may be structured such that through electrodes 50a, 50b, and 50c are individually formed on respective substrates, and are electrically connected with each other by layering the substrates.

Here, the wiring layer 12 of the semiconductor substrate 10 and the semiconductor layer 21 of the semiconductor substrate 20 may be bonded to each other with an adhesive 81. Further, the wiring layer 22 of the semiconductor substrate 20 and the semiconductor layer 31 of the semiconductor substrate 30 may be bonded to each other with an adhesive 82.

Figure 3:
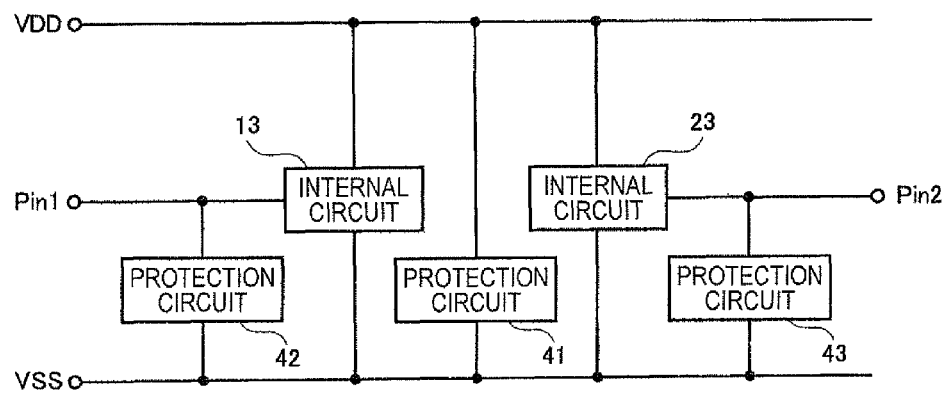
FIG. 3 is a circuit diagram of the semiconductor device according to the embodiment.

FIG. 3 is a circuit diagram of the semiconductor device according to the embodiment. The external terminal VDD serves as a power source terminal coupled to a positive potential, and the external terminal VSS serves as a ground terminal coupled to a ground potential. The external terminal Pin1 serves as an input terminal or an output terminal of the internal circuit 13, and the external terminal Pin2 serves as an input terminal or an output terminal of the internal circuit 23.

The through electrode 51 electrically connected with the external terminal VDD is electrically connected with the internal circuit 13 through the wiring layer 12, is electrically connected with the internal circuit 23 through the wiring layer 22, and is electrically connected with the electrostatic discharge protection circuit 41 through the wiring layer 32.

The through electrode 52 electrically connected with the external terminal VSS is electrically connected with the internal circuit 13 through the wiring layer 12, is electrically connected with the internal circuit 23 through the wiring layer 22, and is electrically connected with the electrostatic discharge protection circuits 41, 42, and 43 through the wiring layer 32.

The through electrode 53 electrically connected with the external terminal Pin1 is electrically connected with the internal circuit 13 through the wiring layer 12 and is electrically connected with the electrostatic discharge protection circuit 42 through the wiring layer 32.

The through electrode 54 electrically connected with the external terminal Pin2 is electrically connected with the internal circuit 23 through the wiring layer 22 and is electrically connected with the electrostatic discharge protection circuit 43 through the wiring layer 32.

Figure 4A:
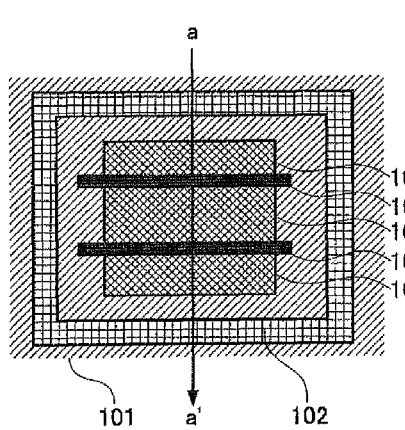
FIGS. 4A and 4B are schematic views for explaining an example of an electrostatic discharge protection circuit according to the embodiment.
Figure 4B:
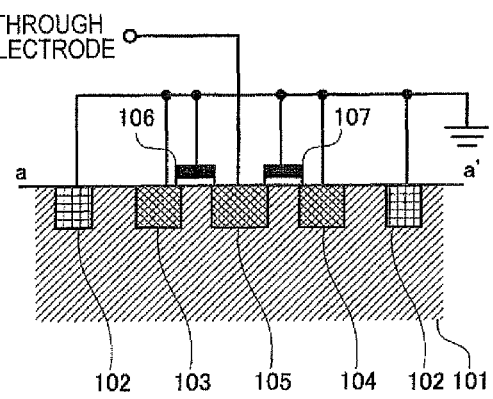

FIGS. 4A and 4B are schematic views for explaining an example of an electrostatic discharge protection circuit of the embodiment. This electrostatic discharge protection circuit shown in FIGS. 4A and 4B is composed of a grounded-gate negative-channel metal oxide semiconductor (ggNMOS). FIG. 4A is a plan view of the ggNMOS, and FIG. 4B is a sectional view showing a section of the ggNMOS taken along an a-a' line of FIG. 4A.

In the ggNMOS shown in FIGS. 4A and 4B, N-diffusion regions 103 and 104 to be source regions and an N-diffusion region 105 to be a drain region are formed in a region surrounded by a P-diffusion region 102 in a P-Well 101.

A silicon oxide film is formed to stride between the N-diffusion region 103 and the N-diffusion region 105, and a poly-silicon layer 106 is formed on the silicon oxide film. Further, a silicon oxide film is formed to stride between the N-diffusion region 104 and the N-diffusion region 105, and a poly-silicon layer 107 is formed on the silicon oxide film.

The P-diffusion region 102, the N-diffusion regions 103 and 104 to be source regions, and the poly-silicon layers 106 and 107 to be gates are coupled to a ground potential. The N-diffusion region 105 to be a drain region is coupled to the through electrodes.

According to the semiconductor device of the embodiment, the electrostatic discharge protection circuits can be integrated on any one of the semiconductor substrates. Accordingly, the electrostatic discharge protection circuits are not required to be formed on the rest of the semiconductor substrates, so that area efficiency is improved and latitude of arrangement and wiring of the circuit element is improved.

Further, the semiconductor substrate on which a plurality of electrostatic discharge protection circuits are provided may be manufactured by a larger design rule than that for the rest of the semiconductor substrates. The semiconductor substrate on which the electrostatic discharge protection circuits are integrated is manufactured in an inexpensive manufacturing process using a large design rule, being able to reduce a cost for manufacturing a semiconductor device.

Figure 5A:
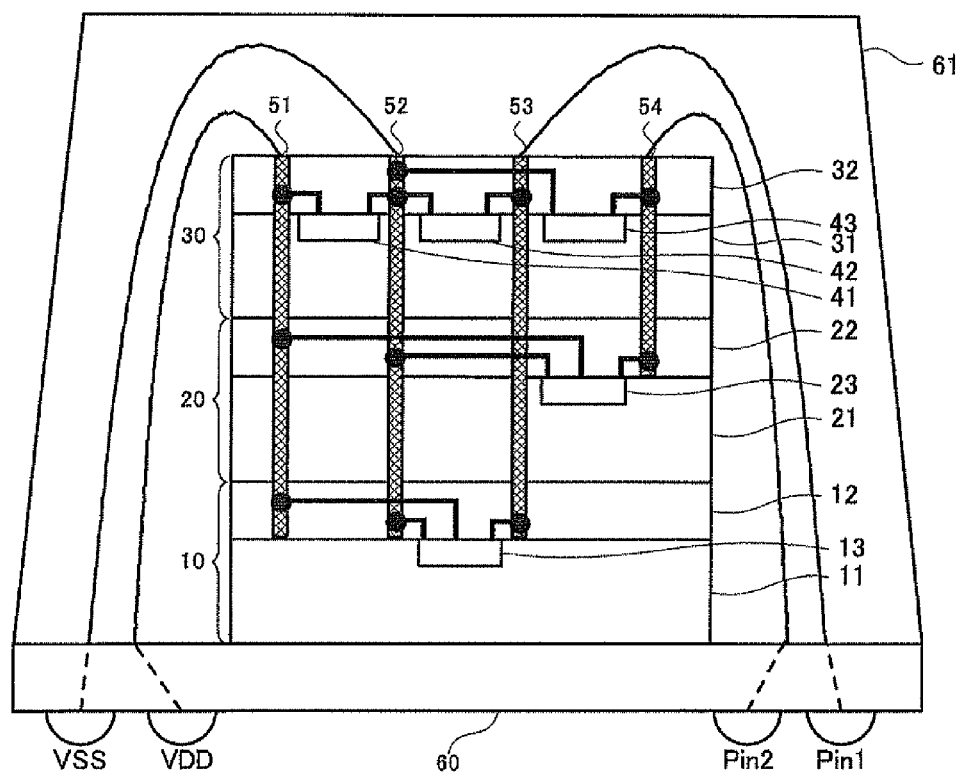
FIGS. 5A and 5B are schematic views for explaining a sectional structure of the semiconductor device according to the embodiment.
Figure 5B:
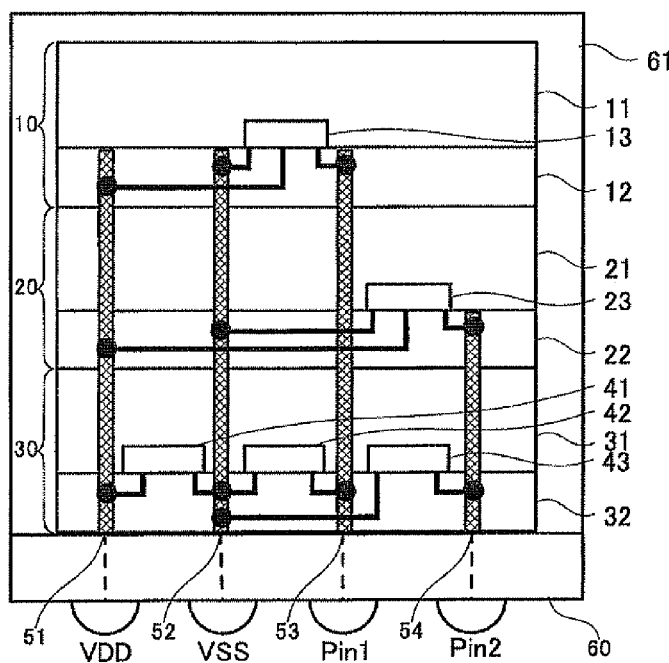

FIGS. 5A and 5B are schematic views for explaining a sectional structure of the semiconductor device of the embodiment. FIG. 5A shows an example of a structure in which a structural body obtained by layering the semiconductor substrates 10, 20, and 30 described with reference to FIG. 1 is disposed with its front surface facing an upside and the structural body is molded with a molding resin 61, on a package substrate 60. FIG. 5B shows an example of a structure in which a structural body obtained by layering the semiconductor substrates 10, 20, and 30 described with reference to FIG. 1 is disposed with its front surface facing a downside and the structural body is molded with the molding resin 61, on the package substrate 60.

In the example shown in FIG. 5A, the package substrate 60 is provided with the external terminals VDD, VSS, Pin1, and Pin2. The through electrodes 51, 52, 53, and 54 are electrically connected with the external terminals VDD, VSS, Pin1, and Pin2 respectively, through wirings and bonding wires inside the package substrate 60.

In such the structure, an electrical path from the external terminals through the through electrodes to the internal circuits passes through the semiconductor substrate 30 which is the uppermost layer. Therefore, the electrostatic discharge protection circuits are provided on the semiconductor substrate 30 which is the uppermost layer. Thus, the electrostatic discharge protection circuits can be integrated on one semiconductor substrate.

In the example shown in FIG. 5B, a package substrate 60 is provided with the external terminals VDD, VSS, Pin1, and Pin2. The through electrodes 51, 52, 53, and 54 are electrically connected with the external terminals VDD, VSS, Pin1, and Pin2 respectively, through wirings inside the package substrate 60.

In such the structure, an electrical path from the external terminals through the through electrodes to the internal circuits passes through the semiconductor substrate 30 which is the lowermost layer. Therefore, the electrostatic discharge protection circuits are provided on the semiconductor substrate 30 which is the lowermost layer. Thus, the electrostatic discharge protection circuits can be integrated on one semiconductor substrate.

MODIFICATION

In addition to the structure of the semiconductor device described in the above embodiment, a simple electrostatic discharge protection circuit may be provided on at least one semiconductor substrate on which the electrostatic discharge protection circuits are not provided. The simple electrostatic discharge protection circuit is electrically connected with at least one through electrode and has a lower electrostatic discharge protection function than the electrostatic discharge protection circuit.

Figure 6:
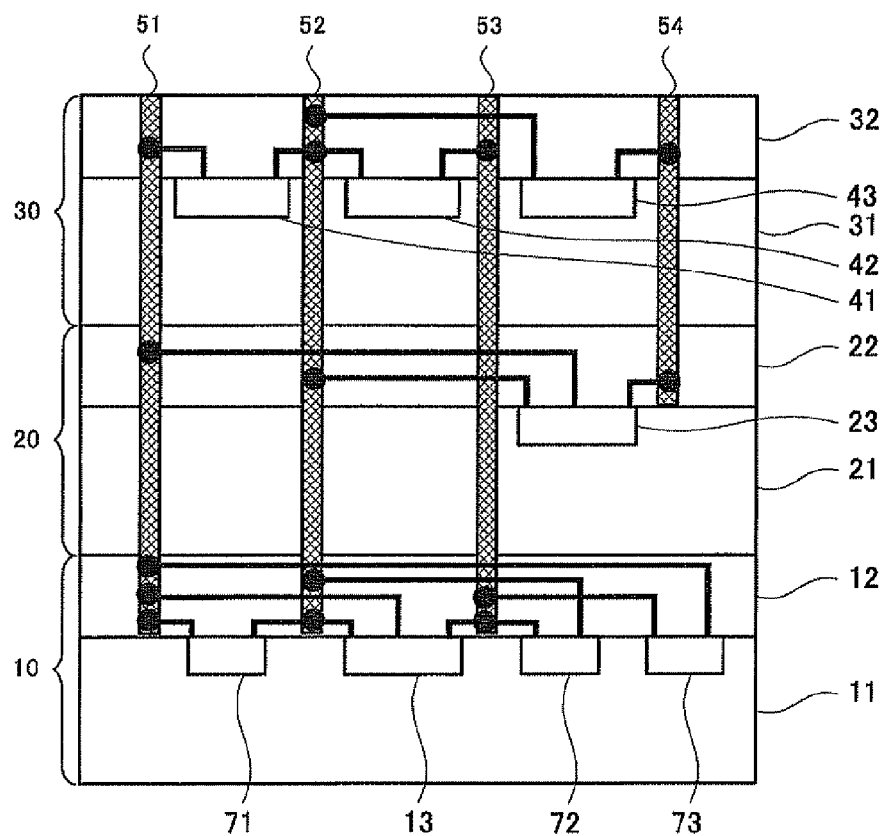
FIG. 6 is a schematic view for explaining an internal structure of a semiconductor device according to the modification.

FIG. 6 is a schematic view for explaining an internal structure of a semiconductor device according to a modification. FIG. 6 shows a case where a simple electrostatic discharge protection circuit is provided on the semiconductor substrate 10.

Figure 7:
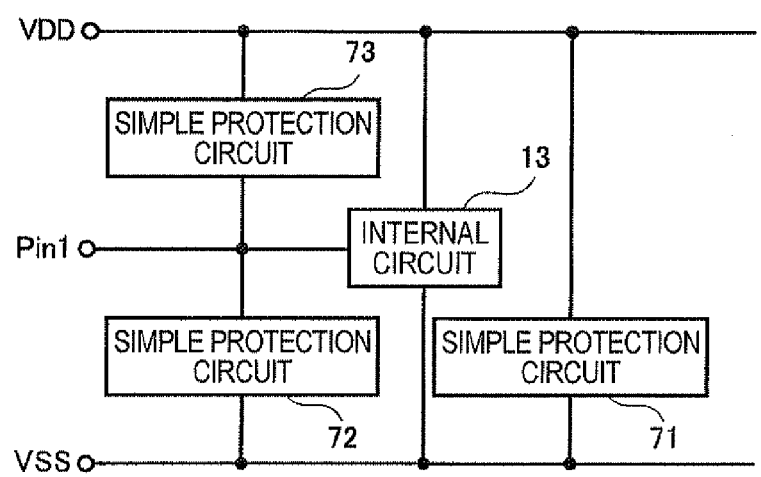
FIG. 7 is a circuit diagram of a semiconductor substrate 10 on which a simple protection circuit is provided.

FIG. 7 is a circuit diagram of the semiconductor substrate 10 in a case where a simple electrostatic discharge protection circuit is provided on the semiconductor substrate 10.

A simple electrostatic discharge protection circuit 71 is electrically connected with the through electrode 51, which is electrically connected with the external terminal VDD, and the through electrode 52, which is electrically connected with the external terminal VSS, through the wiring layer 12.

A simple electrostatic discharge protection circuit 72 is electrically connected with the through electrode 52, which is electrically connected with the external terminal VSS, and the through electrode 53, which is electrically connected with the external terminal Pin1, through the wiring layer 12.

A simple electrostatic discharge protection circuit 73 is electrically connected with the through electrode 51, which is electrically connected with the external terminal VDD, and the through electrode 53, which is electrically connected with the external terminal Pin1, through the wiring layer 12.

Figure 4C:
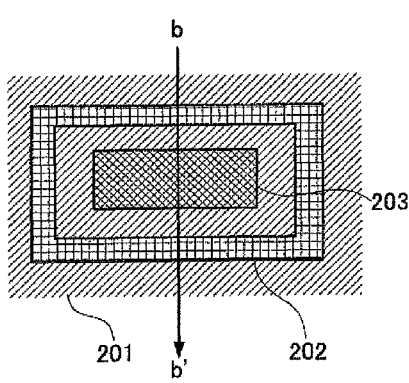
FIGS. 4C and 4D are schematic views for explaining a simple electrostatic discharge protection circuit according to a modification.
Figure 4D:
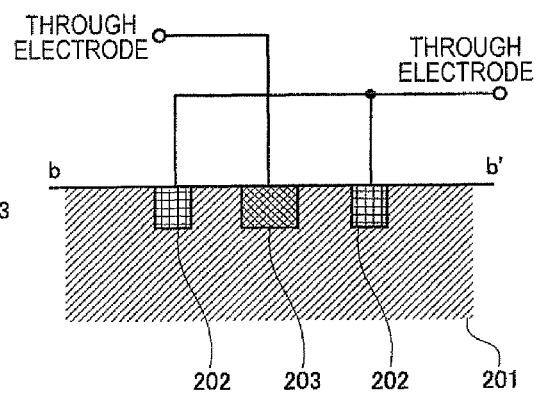

FIGS. 4C and 4D are schematic views for explaining an example of a simple electrostatic discharge protection circuit of the modification. This simple electrostatic discharge protection circuit shown in FIGS. 4C and 4D is composed of a diode. FIG. 4C is a plan view of the diode, and FIG. 4D is a sectional view showing a section of the diode taken along at a b-b' line of FIG. 4C.

In the diode shown in FIGS. 4C and 4D, a P-diffusion region 202 to be an anode and an N-diffusion region 203 to be a cathode, which is in a region surrounded by the P-diffusion region 202, are formed in a P-Well 201.

In regard to the simple electrostatic discharge protection circuit 71, the P-diffusion region 202 is electrically connected with the external terminal VSS through the through electrode 52 and the N-diffusion region 203 is electrically connected with the external terminal VDD through the through electrode 51. In regard to the simple electrostatic discharge protection circuit 72, the P-diffusion region 202 is electrically connected with the external terminal VSS through the through electrode 52 and the N-diffusion region 203 is electrically connected with the external terminal Pin1 through the through electrode 53.

In regard to the simple electrostatic discharge protection circuit 73, the N-diffusion region 203 is electrically connected with the external terminal VDD through the through electrode 51 and the P-diffusion region 202 is electrically connected with the external terminal Pin1 through the through electrode 53.

The simple electrostatic discharge protection circuit structured as this may have a lower electrostatic discharge protection function than the electrostatic discharge protection circuit shown in FIGS. 4C and 4D. It is only necessary for the simple electrostatic discharge protection circuits 71, 72, and 73 to prevent damage by electrostatic discharge in a manufacturing step and a testing step of the semiconductor substrates 10 and 20, because the electrostatic discharge protection circuits 41, 42, and 43 provided on the semiconductor substrate 30 mainly work after the semiconductor device is completed.

Accordingly, the simple electrostatic discharge protection circuits 71, 72, and 73 can be formed to have smaller areas than the electrostatic discharge protection circuits 41, 42, and 43. Therefore, compared to a case where electrostatic discharge protection circuits are provided on all semiconductor substrates, area efficiency is improved and latitude of arrangement and wiring of circuit elements is improved.

Here, it should be noted that the present invention is not limited to the above embodiment but is applicable to various kinds of modifications within the scope and the spirit of the present invention.

The present invention may include substantially the same structures as those described in the above embodiment (for example, the same functions, manners, and results, or the same advantages and advantageous effects as those in the above embodiment). In addition, the present invention includes structures obtained by replacing a nonessential part of the structures described in the embodiment. Further, the invention includes structures offering the same advantageous effects or structures achieving the same objects as those of the structure described in the embodiment. Furthermore, the present invention includes structures obtained by adding related art to the structures described in the embodiment.

For example, the embodiment shows the example including the external terminals VDD, VSS, Pin1, and Pin2, but other external terminals such as an input terminal, an output terminal, a control terminal, and the like may be included.

What is claimed is:

1. A semiconductor device, comprising:
   a plurality of external terminals;
   a plurality of semiconductor substrates that are layered with respect to each other, such that there is no gap between adjacent ones of the semiconductor substrates;
   at least one through electrode penetrating through the semiconductor substrates and electrically connected with at least one of the external terminals;
   a plurality of electrostatic discharge protection circuits, each electrostatic discharge protection circuit being provided on one of the semiconductor substrates, wherein the at least one through electrode is electrically connected with the plurality of electrostatic discharge protection circuits; and
   a simple electrostatic discharge protection circuit electrically connected with the at least one through electrode, the simple electrostatic discharge protection circuit having a lower electrostatic discharge protection function than the electrostatic discharge protection circuits, the simple electrostatic discharge protection circuit being provided on a semiconductor substrate on which no electrostatic discharge protection circuit is provided, the electrostatic discharge protection circuits comprising grounded-gate negative-channel metal oxide semiconductors, and the simple electrostatic discharge protection circuit comprising a diode.

2. The semiconductor device according to claim 1, wherein the at least one through electrode is a plurality of through electrodes, and each of the plurality of electrostatic discharge protection circuits is electrically connected with at least one of the plurality of through electrodes.

3. The semiconductor device according to claim 1, wherein the semiconductor substrates on which the plurality of electrostatic discharge protection circuits are provided include one of a semiconductor substrate that is a lowermost layer with respect to the plurality of semiconductor substrates and a semiconductor substrate that is an uppermost layer with respect to the plurality of semiconductor substrates.

4. The semiconductor device according to claim 1, wherein the semiconductor substrates on which an electrostatic discharge protection circuit is provided are manufactured by a larger design rule than that for the semiconductor substrates on which no electrostatic discharge protection circuit is provided.

5. A method for manufacturing a semiconductor device including a plurality of external terminals and a plurality of semiconductor substrates that are layered with respect to each other, such that there is no gap between adjacent ones of the semiconductor substrates; the method comprising:
   providing a plurality of electrostatic discharge protection circuits, each electrostatic discharge protection circuit being provided on one of the semiconductor substrates;
   providing at least one through electrode penetrating through the semiconductor substrates, each through electrode being electrically connected with at least one of the plurality of external terminals and at least one of the plurality of electrostatic discharge protection circuits;
   a simple electrostatic discharge protection circuit electrically connected with at least one of the through electrodes, the simple electrostatic discharge protection circuit having a lower electrostatic discharge protection function than the electrostatic discharge protection circuits, the simple electrostatic discharge protection circuit being provided on a semiconductor substrate on which no electrostatic discharge protection circuit is provided, the electrostatic discharge protection circuits comprising grounded-gate negative-channel metal oxide semiconductors, and the simple electrostatic discharge protection circuit comprising a diode;
   electrically connecting each of the plurality of electrostatic discharge protection circuits and the at least one through electrode.

* * * * *